United States Patent
Ukeda et al.

(10) Patent No.: US 9,620,731 B2
(45) Date of Patent: Apr. 11, 2017

(54) THIN FILM TRANSISTOR, ORGANIC EL LIGHT EMITTING DEVICE, AND METHOD OF FABRICATING THIN FILM TRANSISTOR

(71) Applicant: PANASONIC CORPORATION, Osaka (JP)

(72) Inventors: Takaaki Ukeda, Osaka (JP); Akihito Miyamoto, Osaka (JP); Norishige Nanai, Osaka (JP)

(73) Assignee: PANASONIC COPRORATION, Osaka (JP)

( * ) Notice: Subject to any disclaimer, the term of this patent is extended or adjusted under 35 U.S.C. 154(b) by 264 days.

(21) Appl. No.: 14/034,949

(22) Filed: Sep. 24, 2013

(65) Prior Publication Data

US 2014/0021457 A1 Jan. 23, 2014

Related U.S. Application Data

(63) Continuation of application No. PCT/JP2012/006484, filed on Oct. 10, 2012.

(30) Foreign Application Priority Data

Oct. 24, 2011 (JP) .................................. 2011-233305

(51) Int. Cl.
*H01L 51/52* (2006.01)
*H01L 51/05* (2006.01)
(Continued)

(52) U.S. Cl.
CPC ...... *H01L 51/5203* (2013.01); *H01L 27/3274* (2013.01); *H01L 29/511* (2013.01);
(Continued)

(58) Field of Classification Search
None
See application file for complete search history.

(56) References Cited

U.S. PATENT DOCUMENTS

| | | | |
|---|---|---|---|
| 5,946,551 A | 8/1999 | Dimitrakopoulos et al. |
| 5,981,970 A | 11/1999 | Dimitrakopoulos et al. |
| (Continued) | | |

FOREIGN PATENT DOCUMENTS

| | | |
|---|---|---|
| JP | 10-270712 | 10/1998 |
| JP | 2005-026698 | 1/2005 |
| (Continued) | | |

OTHER PUBLICATIONS

International Search Report (ISR) and Written Opinion (WO) in International Application No. PCT/JP2012/006484, dated Dec. 25, 2012.

(Continued)

*Primary Examiner* — Phat X Cao
*Assistant Examiner* — Diana C Vieira
(74) *Attorney, Agent, or Firm* — Greenblum & Bernstein, P.L.C.

(57) ABSTRACT

A thin film transistor according to the present disclosure including: a gate electrode above a substrate; a gate insulating layer covering the gate electrode; a semiconductor layer above the gate insulating layer; and a source electrode and a drain electrode which are above the gate insulating layer, and electrically connected to the semiconductor layer, in which the gate insulating layer includes a first area and a second area, the first area being above the gate electrode, the second area being different from an area above the gate electrode, and made of a same substance as the first area, and the first area has a higher density than a density of the second area.

5 Claims, 7 Drawing Sheets

(51) Int. Cl.
  *H01L 29/51* (2006.01)
  *H01L 27/32* (2006.01)
  *H01L 29/66* (2006.01)
  *H01L 29/786* (2006.01)

(52) U.S. Cl.
  CPC ...... *H01L 29/66742* (2013.01); *H01L 29/786* (2013.01); *H01L 51/052* (2013.01); *H01L 51/0516* (2013.01); *H01L 51/0537* (2013.01); H01L 27/3262 (2013.01); H01L 29/512 (2013.01); H01L 51/055 (2013.01); H01L 51/0525 (2013.01); H01L 51/0545 (2013.01)

(56) References Cited

U.S. PATENT DOCUMENTS

| | | | |
|---|---|---|---|
| 6,188,452 B1 * | 2/2001 | Kim | G02F 1/136227 257/59 |
| 6,344,660 B1 | 2/2002 | Dimitrakopoulos et al. | |
| 6,344,662 B1 | 2/2002 | Dimitrakopoulos et al. | |
| 7,005,674 B2 | 2/2006 | Lee et al. | |
| 7,659,138 B2 * | 2/2010 | Hirakata | B82Y 30/00 257/40 |
| 7,880,170 B2 | 2/2011 | Kim et al. | |
| 8,319,223 B2 | 11/2012 | Kim et al. | |
| 2005/0001210 A1 | 1/2005 | Lee et al. | |
| 2005/0045885 A1 | 3/2005 | Kim et al. | |
| 2006/0124925 A1 * | 6/2006 | Kondo | C08G 73/10 257/40 |
| 2008/0116530 A1 * | 5/2008 | Hyun | H01L 21/82343 257/410 |
| 2008/0242112 A1 * | 10/2008 | Wu | H01L 51/0537 438/781 |
| 2008/0308821 A1 * | 12/2008 | Hsu | H01L 29/4908 257/89 |
| 2010/0051940 A1 * | 3/2010 | Yamazaki | H01L 29/4908 257/43 |
| 2010/0194719 A1 | 8/2010 | Saitoh et al. | |
| 2011/0084260 A1 | 4/2011 | Kim et al. | |
| 2012/0181533 A1 * | 7/2012 | Yoo | H01L 27/1248 257/43 |
| 2013/0134429 A1 | 5/2013 | Yamada | |
| 2013/0240871 A1 | 9/2013 | Shimoda et al. | |
| 2014/0048883 A1 * | 2/2014 | Ukeda | H01L 51/0529 257/347 |

FOREIGN PATENT DOCUMENTS

| | | |
|---|---|---|
| JP | 2005-079598 | 3/2005 |
| JP | 2007-250842 | 9/2007 |
| JP | 2008-140786 | 6/2008 |
| JP | 2010-040999 | 2/2010 |
| WO | 2006/104068 | 10/2006 |
| WO | 2007/114254 | 10/2007 |
| WO | 2011/138958 | 11/2011 |

* cited by examiner

FIG. 5
(a)
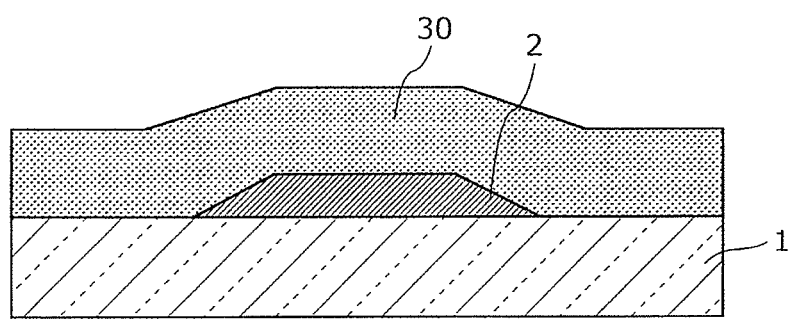
(b)
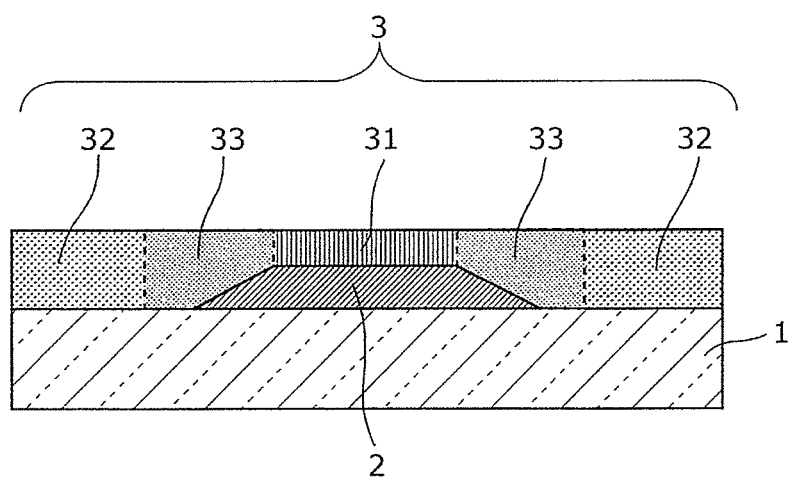

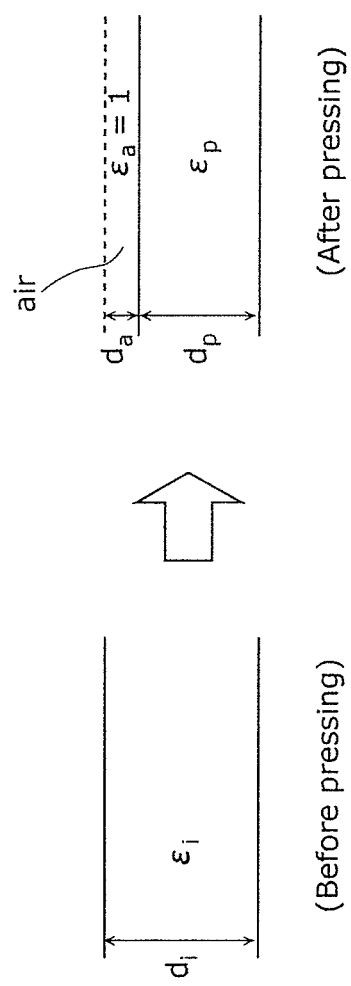

THIN FILM TRANSISTOR, ORGANIC EL LIGHT EMITTING DEVICE, AND METHOD OF FABRICATING THIN FILM TRANSISTOR

CROSS REFERENCE TO RELATED APPLICATIONS

This is a continuation application of PCT International Application No. PCT/JP2012/006484 filed on Oct. 10, 2012, designating the United States of America, which is based on and claims priority of Japanese Patent Application No. 2011-233305 filed on Oct. 24, 2011. The entire disclosures of the above-identified applications, including the specifications, drawings and claims are incorporated herein by reference in their entirety.

FIELD

The embodiment disclosed herein relates to a thin film transistor, an organic EL light emitting device, and a method of fabricating a thin film transistor.

BACKGROUND

In active-matrix displays such as liquid crystal displays or organic electro luminescence (EL) displays, thin film transistors (TFTs) are used in pixel circuits.

For example, a thin film transistor includes a substrate, a gate electrode on the substrate, a gate insulating film over the gate electrode, a semiconductor layer on the gate insulating film, a source electrode and a drain electrode which are electrically connected to the semiconductor layer.

Although silicon is often used for semiconductor layers of thin film transistors, organic thin film transistors whose semiconductor layers are made of organic materials have been in development in recent years. For example, Patent Literature 1 (PTL 1) discloses a conventional organic thin film transistor (PTL 1).

CITATION LIST

Patent Literature

[PTL 1] Japanese Unexamined Patent Application Publication No. 10-270712

SUMMARY

Technical Problem

In recent years, as display screens have been becoming larger, lines in pixel circuits have been also becoming longer. Since longer line increases line resistance and current losses in lines, the resistance reduction of lines is desirable. Lines are often patterned together with a gate electrode and a source electrode (drain electrode) in a thin film transistor at the same time. Therefore, resistance reduction of the lines requires the resistance reduction of the gate electrode and others.

Here, as one way to lower line resistance, thickening of a line, i.e., thickening of the gate electrode and the source electrode (drain electrode) can be considered. On the other hand, to improve the characteristics of a thin film transistor, preferably a gate insulating film should be thinned.

However, when the thickened gate electrode is coated with the thin gate insulating film, the coatability of the gate insulating film with respect to the gate electrode deteriorates, thus degrading the voltage endurance characteristics of the gate insulating film.

One non-limiting and exemplary embodiment provides (i) a thin film transistor having a gate insulating film with improved voltage endurance characteristics, (ii) an organic EL light emitting device having the thin film transistor, and (iii) a method of fabricating the thin film transistor.

Solution to Problem

In one general aspect, the techniques disclosed here feature a thin film transistor including: a gate electrode above a substrate; a gate insulating layer covering the gate electrode; a semiconductor layer above the gate insulating layer; and a source electrode and a drain electrode which are above the gate insulating layer, and electrically connected to the semiconductor layer, in which the gate insulating layer includes a first area and a second area, the first area being above the gate electrode, the second area being different from an area above the gate electrode, and made of a same substance as the first area, the first area has a higher density than a density of the second area, and the gate insulating layer has a flat surface at an area above which an area where the semiconductor layer and at least one of the source electrode and the drain electrode are contiguous is located.

In one general aspect, the techniques disclosed here feature a method of fabricating a thin film transistor including: (a) forming a gate electrode above a substrate; (b) forming a gate insulating layer to cover the gate electrode; (c) forming a source electrode and a drain electrode above the gate insulating layer so as to sandwich an area above the gate electrode; and (d) forming a semiconductor layer to be electrically connected to the source electrode and the drain electrode, in which step (b) includes: applying an insulating material to cover the gate electrode; heating the insulating material in a state where the insulating material applied to the area above the gate electrode protrudes over the insulating material applied to an area different from the area above the gate electrode; and after the heating of the insulating material, pressing a surface of the insulating material with a press member.

Additional benefits and advantages of the disclosed embodiments will be apparent from the Specification and Drawings. The benefits and/or advantages may be individually obtained by the non-limiting embodiment and features of the Specification and Drawings, which need not all be provided in order to obtain one or more of such benefits and/or advantages.

Advantageous Effects

According to the exemplary embodiment, not only the voltage endurance characteristics of the gate insulating film can be improved, but also high relative permittivity of the gate insulating layer on the gate electrode can improve TFT characteristics.

BRIEF DESCRIPTION OF DRAWINGS

These and other advantages and features will become apparent from the following description thereof taken in conjunction with the accompanying Drawings, by way of non-limiting examples of embodiments disclosed herein.

FIGS. 5(a)-(b) illustrate configurations of a thin film transistor according to a modification of the embodiment.

FIG. 6A illustrates conditions of a gate insulating layer before and after being pressed in a thin film transistor according to the embodiment.

DESCRIPTION OF EMBODIMENT

Figure 1:
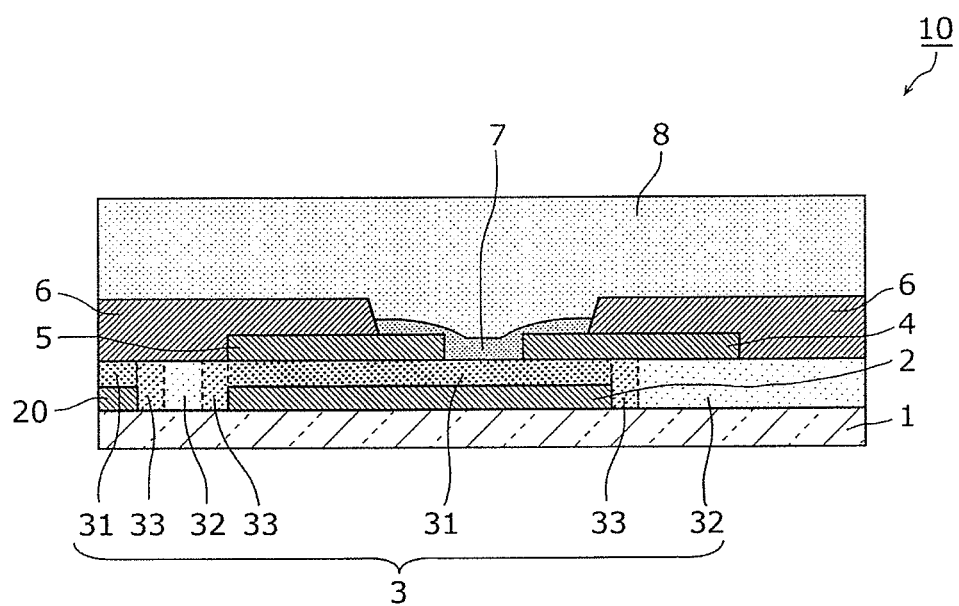
FIG. 1 is a cross-sectional view of a thin film transistor according to the embodiment.

In one general aspect, the techniques disclosed here feature a thin film transistor including: a gate electrode above a substrate; a gate insulating layer covering the gate electrode; a semiconductor layer above the gate insulating layer; and a source electrode and a drain electrode which are above the gate insulating layer, and electrically connected to the semiconductor layer, in which the gate insulating layer includes a first area and a second area, the first area being above the gate electrode, the second area being different from an area above the gate electrode, and made of a same substance as the first area, the first area has a higher density than a density of the second area, and the gate insulating layer has a flat surface at an area above which an area where the semiconductor layer and at least one of the source electrode and the drain electrode are contiguous is located.

According to the present embodiment, since the gate insulating layer on the gate electrode corresponds to the high-density first area, the voltage endurance characteristics of the gate insulating layer can be improved. This enables the employment of a method of thickening the gate electrode and the lines in the same layer as the gate electrode. Therefore, low-resistance lines can be fabricated.

Furthermore, according to the present embodiment, since the first area corresponding to the gate insulating layer on the gate electrode has a higher relative permittivity than that of the second area, the density of the carriers induced to the channel area of the semiconductor layer becomes high. This can improve TFT characteristics.

Furthermore, since the first and second areas are made of the same substance in the present embodiment, there is no interface between the first and second areas. This can suppress the generation of a leak current, and thus it is possible to suppress degradation in the voltage endurance characteristics of the gate insulating layer.

Moreover, in one aspect of a thin film transistor according to the present disclosure, the second area may be between the gate electrode and another gate electrode adjacent to the gate electrode.

According to this aspect, the second area between the adjacent gate electrodes has a lower relative permittivity than that of the first area above the gate electrode. This can reduce parasitic capacitance which occurs between the adjacent gate electrodes. Furthermore, since the relative permittivity between the adjacent gate electrodes is small, the response speed of the thin film transistor can be improved.

Moreover, in one aspect of the thin film transistor according to the present disclosure, the gate insulating layer may include the third area between the first area and the second area. In addition, the third area may have a transition density from the film density of the first area to the film density of the second area.

According to this aspect, since the edges of the gate electrode are covered by the third areas having a higher average density than that of the second area, point discharge likely to occur at the edges of the gate electrode can be reduced. This can further improve the voltage endurance characteristics of the gate insulating layer 3.

Moreover, in one aspect of the thin film transistor according to the present disclosure, the gate insulating layer may be an organic insulating film. In this case, preferably, the organic insulating film should be made of an organic material to part of which an inorganic material is added.

According to the aspect, by applying the material of the organic insulating film, and subsequently pre-baking and vaporizing the solvent and pressing and compressing it in an uncured state, an organic insulating film having areas of different film densities can be easily formed. Thus, it is possible to easily form the gate insulating layer including a high-density first area and a low-density second area.

Moreover, in one general aspect, the techniques disclosed here feature an organic EL light emitting device including: the thin film transistor according to any one described above; a planarization film which is above the thin film transistor, and has a contact hole; a lower electrode which is above the planarization film, and is electrically connected to the drain electrode or the source electrode via the contact hole; an upper electrode above the lower electrode; and an organic light emitting layer between the lower electrode and the upper electrode.

According to this aspect, the thin film transistor having the gate insulating layer with excellent voltage endurance characteristics is used. Therefore, as a method of reducing line resistance, a method of thickening lines as well as the gate electrode can be employed. This can realize lines with less current losses even when the organic EL light emitting device becomes bigger. Therefore, it is possible to realize organic EL light emitting devices capable of high-speed operation.

Furthermore, according to this aspect, since the gate insulating layer above the gate electrode corresponding to the first area has a higher relative permittivity than those of other areas, the density of the carriers induced to the channel area in the semiconductor layer becomes high. Since this can improve the TFT characteristics of the thin film transistor, it is possible to realize organic EL light emitting devices capable of higher-speed operation.

In one general aspect, the techniques disclosed here feature a method of fabricating a method of fabricating a thin film transistor including: (a) forming a gate electrode above a substrate; (b) forming a gate insulating layer to cover the gate electrode; (c) forming a source electrode and a drain electrode above the gate insulating layer so as to sandwich an area above the gate electrode; and (d) forming a semiconductor layer to be electrically connected to the source electrode and the drain electrode, in which step (b) includes: applying an insulating material to cover the gate electrode; heating the insulating material in a state where the insulating material applied to the area above the gate electrode protrudes over the insulating material applied to an area different from the area above the gate electrode; and after the heating of the insulating material, pressing a surface of the insulating material with a press member.

According to this aspect, since it is possible to make the protruded part of the organic insulating material on the gate electrode have a higher compressibility than that of the organic insulating material at another area, the gate insulating layer which includes the first and second areas of different film densities can be formed.

Moreover, in one general aspect, the techniques disclosed here feature the method of fabricating the thin film transistor in which in the applying in step (b), a same insulating material may be applied to the area above the gate electrode and the area other than the area above the gate electrode.

According to this aspect, since an interface is not formed between the areas of different densities, it is possible to suppress degradation in the voltage endurance characteristics of the gate insulating layer. Furthermore, compared to when the gate insulating layer is made of different kinds of materials having different densities, the step of forming the gate insulating layer can be simplified.

Moreover, in one general aspect, the techniques disclosed here feature the method of fabricating the thin film transistor, in which in the pressing in step (b), a first area corresponding to the area above the gate electrode in the gate insulating layer may have a higher density than a density of an area different from the first area in the gate insulating layer.

According to this aspect, it is possible to obtain a thin film transistor having a gate insulating layer with excellent voltage endurance characteristics and TFT characteristics.

Moreover, in one general aspect, the techniques disclosed here feature the method of fabricating the thin film transistor, in which in step (a), another gate electrode to be adjacent to the gate electrode may be formed, in the applying in step (b), the insulating material may be applied to cover the gate electrode and the another gate electrode, and in the pressing in step (b), a first area may have a higher density than a density of a second area, the first area corresponding to an area above the gate electrode in the gate insulating layer, the second area corresponding to an area between the gate electrode and the another gate electrode adjacent to the gate electrode in the gate insulating layer.

According to this aspect, it is possible to obtain a thin film transistor which can reduce parasitic capacitance which occurs between the adjacent electrodes.

Moreover, in one general aspect, the techniques disclosed here feature the method of fabricating the thin film transistor, in which in the pressing in step (b), a third area between the first area and the second area in the gate insulating layer may have a density which transitions from a density of the first area to a density of the second area.

According to this aspect, it is possible to obtain a thin film transistor with excellent voltage endurance characteristics. This is because point discharge which occurs at the edges of the gate electrode is reduced in the thin film transistor.

Moreover, in one general aspect, the techniques disclosed here feature the method of fabricating the thin film transistor, in which in the applying in step (b), an insulating material may be applied toward the gate electrode, the insulating material having a higher permittivity than a permittivity of an insulating material to be applied to the area other than the area above the gate electrode.

According to this aspect, since the density difference and the permittivity difference between the first and second areas can be easily increased, the density of the carriers induced to the channel area can be easily improved.

Moreover, in one general aspect, the techniques disclosed here feature the method of fabricating the thin film transistor, in which step (b) may further include after the pressing, curing the insulating material by at least ultraviolet irradiation treatment or heat treatment.

According to this aspect, molecule binding can be strengthened by refining the molecular structure of the insulating material.

Moreover, in one general aspect, the techniques disclosed here feature the method of fabricating the thin film transistor, in which the press member may have a flat surface, and in the pressing in step (b), the insulating material may be pressed using the flat surface.

According to this aspect, a larger pressure can be applied to the protruded part of the insulating material than to the non-protruded part of the insulating material. This can easily form areas of different film densities in the insulating material.

Moreover, in one general aspect, the techniques disclosed here feature the method of fabricating the thin film transistor, in which in the heating of the insulating material in step (b), at least a surface of the insulating material may be solidified.

According to this aspect, the unevenness of the insulating material can be easily maintained by suppressing the flow and spread of the insulating material. Therefore, a higher pressure can be easily applied to the protruded part of the insulating material above the gate electrode than to the other areas. Since this can increase the compressibility of the organic insulating material above the gate electrode, the organic insulating material above the gate electrode can be easily densified.

Moreover, in one general aspect, the techniques disclosed here feature the method of fabricating the thin film transistor, in which in the pressing in step (b), the press member may be pressed with an adherence-prevention protection sheet being interposed between the press member and a surface of the insulating material to prevent the insulating material from adhering to the press member.

According to this aspect, since it is possible to prevent the insulating material from adhering to the press member, it is possible to avoid undermining the planarization of the surface of the organic insulating material after being pressed.

Moreover, in one general aspect, the techniques disclosed here feature the method of fabricating the thin film transistor, in which in the heating of the insulating material, the insulating material may be heated at or above a boiling point of a solvent in the insulating material.

According to this aspect, at least part of the solvent of the insulating material can be certainly vaporized, and in the subsequent pressing step, a density gradient can be produced in the insulating material.

Moreover, in one general aspect, the techniques disclosed here feature the method of fabricating the thin film transistor, in which in the pressing, a surface of the insulating material may be pressed with a press member to include an area above which an area where the semiconductor layer and at least one of the source electrode and the drain electrode are contiguous is formed.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment

The following describes an embodiment of a thin film transistor and a method of fabricating the thin film transistor according to the present disclosure. It should be noted that the scope of the present disclosure is defined based on the description in Claims. Therefore, among the structural elements in the following embodiment, the structural elements not recited in Claims are not necessarily required to achieve the problem of the present disclosure, but make up a preferable embodiment. It should be noted that each view is a schematic view, and is not necessarily a precisely drawn figure.

With reference to FIG. 1, the following describes a thin film transistor 10 according to the embodiment. FIG. 1 is a cross-sectional view illustrating a configuration of a thin film transistor according to the first embodiment.

As shown in FIG. 1, the thin film transistor 10 according to the present embodiment is a bottom gate type and p type (p-channel) TFT, and includes a substrate 1, a gate electrode 2, a gate insulating layer 3, a source electrode 4, a drain electrode 5, a partition portion 6, a semiconductor layer 7, and a planarization film 8. The following details each structural element of the thin film transistor 10.

The substrate 1 is, for example, a glass substrate made of quartz glass or non-alkali glass. It should be noted that a flexible substrate and the like such as a plastic film may be used for the substrate 1.

The gate electrode 2 is patterned into a predetermined shape on the substrate 1. The gate electrode 2 has a single-layer or multi-layer structure of a conductive material or more specifically alloy, for example. The gate electrode 2 is formed using, for example, molybdenum (Mo), aluminum (Al), copper (Cu), tungsten (W), titanium (Ti), chrome (Cr), or molybdenum tungsten (MoW).

The gate insulating layer 3 is formed to cover the gate electrode 2. In the present embodiment, the gate insulating layer 3 is formed over the entire surface of the substrate 1 such that the gate insulating layer 3 not only covers the gate electrode 2 in the thin film transistor 10, but also covers other electrodes and lines formed in the same layer as the gate electrode 2 such as a gate electrode 20 and lines of another thin film transistor adjacent to the thin film transistor 10. The gate insulating layer 3 can be made of an organic insulating film of, for example, polyimide, polyvinyl phenol, or polypropylene. It should be noted that this organic insulating film may be made of an organic material to part of which an inorganic material such as a silicone oxide film or an alumina is added.

Moreover, the gate insulating layer 3 includes a first area 31, a second area 32, and a third area 33. The first area 31 is above the gate electrode 2. The second area 32 is different from the area above the gate electrode 2. The third area 33 is between the first and second areas. In the present embodiment, the second area 32 and the third area 33 are the areas where the gate electrode 2 is not formed, on the substrate 1, and areas directly formed on the substrate 1. The third area 33 of these areas is an area on the sides of the gate electrode 2.

In the gate insulating layer 3, the first area 31 is a high-density area having a higher film density than those of the other areas. Moreover, the second area 32 is a low-density area having a lower film density than those of the other areas. The third area 33 is a transition-density area where the film density transitions from the film density of the first area 31 to the film density of the second area 32.

Moreover, in the present embodiment, the first area 31, the second area 32, and the third area 33 are made of the same substance. Therefore, each area has a different film density and a relative permittivity according to the corresponding film density. Specifically, the relative permittivity of the high-density first area 31 is higher than those of other areas. The relative permittivity of the low-density second area 32 is lower than those of other areas. Moreover, the relative permittivity of the third area 33 is between that of the first area 31 and that of the second area 32.

Here, when (i) the film density is p1, the relative permittivity is $\in$1, and the film thickness is t1 in the first area 31, (ii) the film density is p2, the relative permittivity is $\in$2, and the film thickness is t2 in the second area 32, and (iii) the average film density is p3, the relative permittivity is $\in$3, and the film thickness is t3 in the third area 33, the relationships $p1 > p3 > p2$, $\in1 > \in3 > \in2$, and $t1 < t3 = t2$ are satisfied in the present embodiment. Moreover, when the film thickness of the gate electrode 2 is tg, the relationship $tg < t2 = t3$ is satisfied.

It should be noted that although the thickness of the gate electrode 2 produces the steps of the surface of the gate insulating layer 3, the steps are small and the gate insulating layer 3 has a approximately planer surface. At least, the steps are shorter than the film thickness tg of the gate electrode 2.

The source electrode 4 and the drain electrode 5 forming a pair are formed so as to sandwich an area above the gate electrode 2. That is, the source electrode 4 and the drain electrode 5 are spaced apart above the gate insulating layer 3, and face each other at a predetermined distance above the gate electrode 2. Moreover, the facing edges of the source electrode 4 and the drain electrode 5 are exposed to the hole of the partition portion 6. That is, the edges on the hole side of the source electrode 4 and the drain electrode 5 are positioned in the hole of the partition portion 6 in a planar view.

Moreover, the source electrode 4 and the drain electrode 5 are a single-layer or multi-layer structure of a conductive material or more specifically alloy, for example. The source electrode 4 and the drain electrode 5 can be made using, for example, molybdenum (Mo), tungsten (W), copper (Cu), aluminum (Al), nickel (Ni), gold (Au), silver (Ag), molybdenum tungsten (MoW), or molybdenum nitride (MoN).

The partition portion 6 is formed on the gate insulating layer 3 so as to cover the source electrode 4 and the drain electrode 5. Moreover, the partition portion 6 has holes corresponding to channel portions (semiconductor layer 7) to obtain separate portions of the semiconductor layer 7 which correspond to pixels.

A hole of the partition portion 6 is formed above the gate electrode 2, and has a rectangular shape in a planar view in the present embodiment. The partition portion 6 is a bank which defines the boundary of the semiconductor layer 7, and serves to hold back the flow of an organic semiconductor solution applied to the hole in order to form the semiconductor layer 7. The partition of the partition portion 6 can be formed with a photosensitive material such as a resist, and an hole can be formed by partially exposing to light and developing this photosensitive resin. It should be noted that preferably, the surface of the partition portion 6 should also have water repellency by performing a predetermined surface treatment for the partition portion 6 with, for example, fluorine.

The semiconductor layer 7 is surrounded by the partition (inner wall of the hole) of the partition portion 6. The inner wall surface defines the periphery of the semiconductor layer 7. The semiconductor layer 7 is formed on the gate insulating layer 3, and is formed across the upper surface of the portion where the source electrode 4 is exposed to the hole, the upper surface of the portion where the gate insulating layer 3 is exposed to the hole, and the upper surface of the portion where the drain electrode 5 is exposed to the hole.

The semiconductor layer 7 in the present embodiment is a coat-type organic semiconductor layer which is formed by applying an organic material. The organic semiconductor layer can be formed by applying a solvent containing a predetermined organic semiconductor material to the hole of the partition portion 6 by a screen printing method such as an ink-jet method and crystallizing. A soluble organic semiconductor material of pentacene, phthalocyanine, porphyrin or the like can be used as a material of an organic semiconductor layer.

It should be noted that the semiconductor layer 7 in the hole of the partition portion 6 may be coated with a protective film to protect the semiconductor layer 7. This can efficiently block moisture, oxygen, or impurities from entering the semiconductor layer 7.

The planarization film 8 is formed above the partition portion 6 so as to cover the semiconductor layer 7 and fill in the hole of the partition portion 6. The planarization film 8 is a film for planarizing the surface of the thin film transistor 10 and an interlayer dielectric for suppressing the occurrence of a leakage current between layers. The planarization film 8 can be formed using, for example, an organic material such as a resist or an inorganic material such as a spin on glass (SOG).

The following describes the effects of the thin film transistor 10 according to the embodiment.

The thin film transistor 10 according to the present embodiment can be used in, for example, the pixel circuits of display panels. Here, when the upsizing of a display panel extends lines, line resistance becomes high and current loss increases. Therefore, reduction of line resistance is desired. In particular, when a thin film transistor is used as the driving transistor of an organic EL display panel, a desired electric current needs to be supplied to a current-driven organic EL light emitting device. Therefore, current losses in a line should be avoided since it deteriorates image quality.

Line resistance needs to be reduced to decrease the current losses in the line. As one of the ways to reduce the line resistance, thickening of the line can be considered. For example, although aluminum (Al) or copper (Cu) which has a low resistance is used for a line material to enable high-speed operation, the film thickness of a line in an organic EL display panel needs to be 500 to 1000 nm or 1000 nm or longer. Here, using the materials of a gate electrode and a source electrode (drain electrode) in a thin film transistor, lines are patterned together with those electrodes. Therefore, thickening of the lines means thickening of the gate electrode and others in the same layer as the lines.

However, it is preferable that the gate insulating layer be thinned in order to improve TFT characteristics in the thin film transistor. For example, the film thickness of the gate insulating layer should be around 100 to 300 nm at the thickest.

In this case, there is a problem in that in order to achieve the thickening of the line and the thinning of the gate insulating layer at the same time, the gate electrode which has become thicker as the lines have become thicker is coated with an extremely thin gate insulating layer the thickness of which is a fraction of the thickness of the gate electrode, in the bottom gate thin film transistor, resulting in degradation in the voltage endurance characteristics of the gate insulating layer. In particular, at the corner of the gate electrode, the voltage endurance characteristics of the gate insulating film significantly decreases as the gate insulating layer is thinned. Furthermore, when the voltage endurance characteristics of the gate insulating layer degrades, the yield of display panels having the thin film transistors declines.

Meanwhile, according to the thin film transistor 10 in the embodiment, the gate insulating layer 3 on the gate electrode 2 corresponds to the high-density first area 31. Therefore, the voltage endurance characteristics of the gate insulating layer 3 can be improved. This can maintain the desired voltage endurance characteristics even when the gate electrode 2 is thickened. Therefore, when a line is formed by patterning together with the gate electrode 2, the line is thickened by thickening the gate electrode 2, which can reduce resistance. As a result, even when a display panel becomes larger, a line with less current losses can be realized. Therefore, it is possible to perform high-speed operation and realize a display panel with high image quality.

Furthermore, according to the thin film transistor 10 in the present embodiment, the first area 31 above the gate electrode 2 has a higher density than that of the second area 32 different from the area above the gate electrode 2. Therefore, the relative permittivity of the gate insulating layer 3 (first area 31) above the gate electrode 2 is higher than that of other area. Since this can densify carriers induced to the channel area of the semiconductor layer 7, TFT characteristics can be improved.

Moreover, in the present embodiment, the second area 32 in the gate insulating layer 3 is between the gate electrode 2 in the thin film transistor 10 and another gate electrode 20 adjacent to the gate electrode 2. That is, the second area 32 having a lower density than that of the first area 31 is between the gate electrode of one of the thin film transistors and the gate electrode of the other transistor in the two adjacent thin film transistors. Thus, the relative permittivity of the second area 32 between the adjacent gate electrodes is smaller than that of the first area 31 above the gate electrode 2. Therefore, parasitic capacitance which occurs between the adjacent gate electrodes can be reduced. Moreover, since the relative permittivity between the adjacent gate electrodes is small, the response speed of thin film transistors can be improved.

Moreover, in the present embodiment, the film density of the third area 33 near the edge of the gate electrode 2 is the transition density from the film density of the first area 31 to the film density of the second area 32. Thus, the edge of the gate electrode 2 is coated with the third area 33 having a higher average density than that of the second area 32. Therefore, point discharge likely to occur at the edge of the gate electrode 2 can be reduced. Therefore, the voltage endurance characteristics of the gate insulating layer 3 can be further improved.

It should be noted that although the first area 31, the second area 32, and the third area 33 in the gate insulating layer 3 are made of the same substance in the present embodiment, the first area 31, the second area 32, and the third area 33 may be formed using different kinds of materials. For example, an insulating material applied toward the gate electrode 2 may be a substance having a higher relative permittivity than those of insulating materials applied to areas other than the area above the gate electrode 2. By forming the first area 31, the second area 32, and the third area 33 with different materials in this way, the density differences and the relative permittivity differences between the areas can be easily increased. Therefore, the density of carriers induced to the channel area can be further improved, and thus TFT characteristics can be further improved.

However, when the gate insulating layer 3 is formed with different kinds of materials, an interface is formed between the areas of different materials, and a leak current is likely to flow through the interface, which degrades voltage endurance characteristics. Meanwhile, when the different density areas in the gate insulating layer 3 are made of the same substance as the present embodiment, the different density areas are continuous, which prevents the formation of the interface as described above. Therefore, this can suppress the degradation in the voltage endurance characteristics of the gate insulating layer 3. Therefore, as the thin film transistor 10 according to the present embodiment, preferably, the first area 31, the second area 32, and the third area 33 in the gate insulating layer 3 should be made of the same substance.

Moreover, when the gate insulating layer 3 is made of the same material, preferably, the gate insulating layer 3 should be made of an organic insulating film. By applying the material of the organic insulating film, subsequently pre-baking and vaporizing the solvent, and pressing and compressing it in an uncured state, an organic insulating film having areas of different film densities can be easily formed. Therefore, it is possible to easily form the gate insulating layer 3 including the high density area 31 and the low density area 32.

Figure 2:
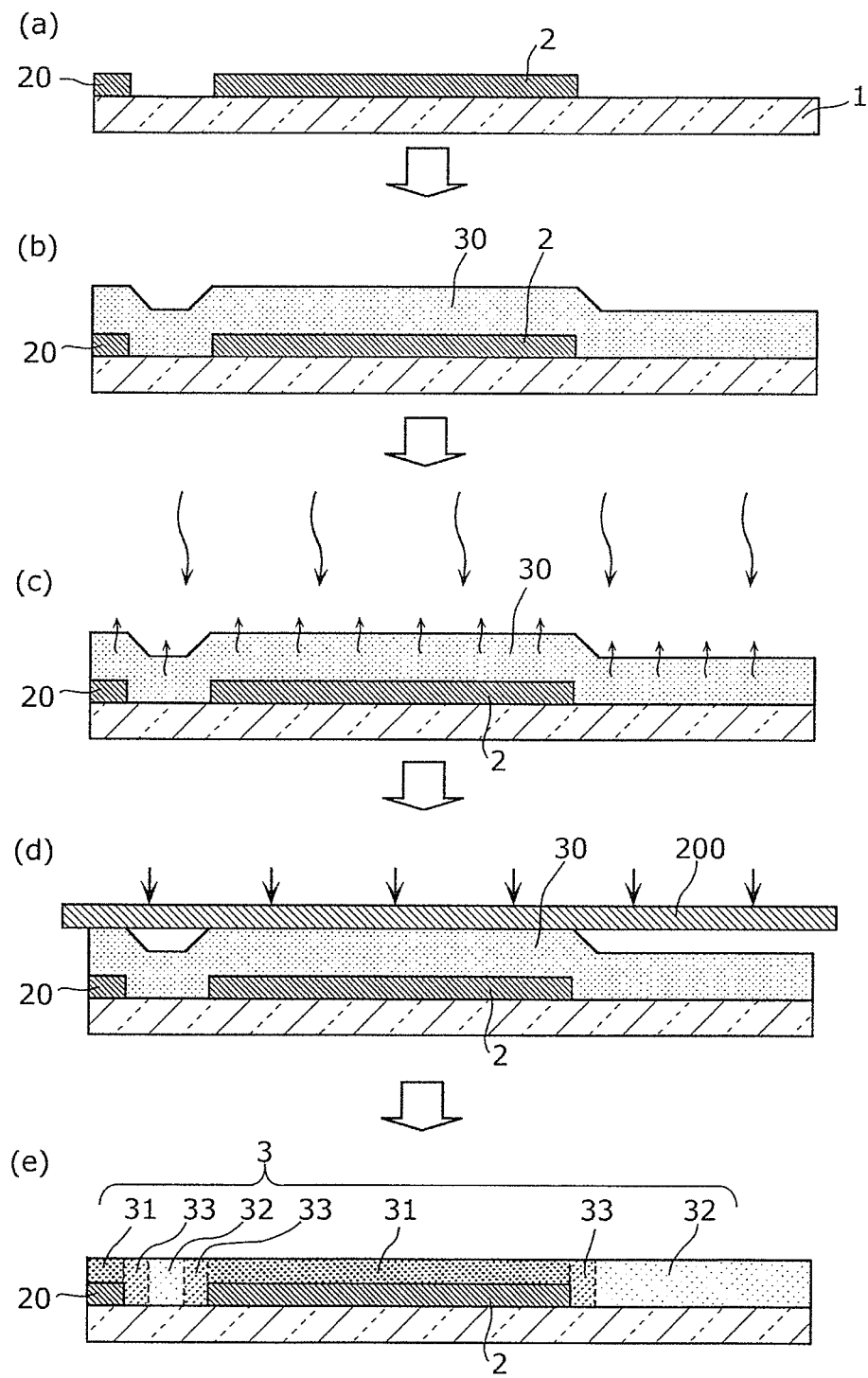
FIGS. 2(a)-(e) are cross-sectional views for explaining each step in a method of fabricating a thin film transistor according to the embodiment.
Figure 3:
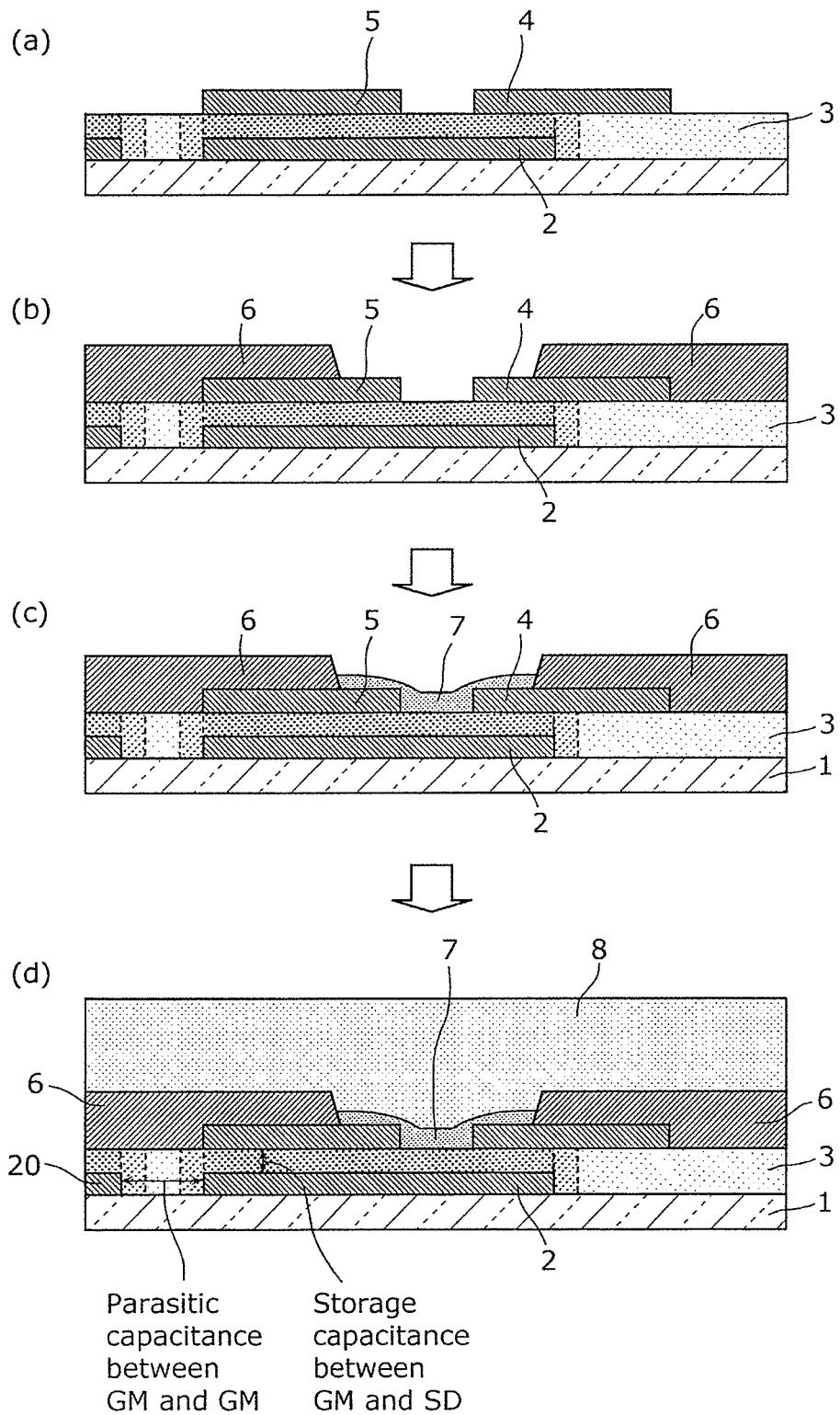
FIGS. 3(a)-(d) are cross-sectional views for explaining each step in a method of fabricating a thin film transistor according to the embodiment.

With reference to FIGS. 2 and 3, the following describes a method of fabricating the thin film transistor 10 according to the embodiment. FIGS. 2 and 3 are cross-sectional views for explaining the steps of the method of fabricating the thin film transistor according to the embodiment.

As shown in (a) in FIG. 2, the gate electrode 2 of a predetermined shape is formed on the substrate 1 such as a glass substrate (step of forming a gate electrode). Specifically, the material of the gate electrode 2 is deposited on the substrate 1 by sputtering or evaporation to form a gate metal film. Subsequently the gate metal film is patterned by photolithography or etching, so that the gate electrode 2 of the predetermined shape is formed.

Here, when more than one thin film transistor is formed on the substrate 1, the gate electrodes corresponding to the thin film transistors are also formed at the same time. For example, as shown in (a) in FIG. 2, the gate electrode 20 adjacent to the gate electrode 2 is patterned together with the gate electrode 2 at the same time. Moreover, when lines are also formed on the substrate 1 at the same time, using the material of the gate electrode 2, the lines are also patterned together with the gate electrode 2 when patterning the gate metal film. For example, the gate line to be connected to the gate electrode 2 is patterned together with the gate electrode 2 at the same time.

With reference to (b) to (e) in FIG. 2, the gate insulating layer 3 having different density areas is formed to cover the gate electrode 2 (step of forming a gate insulating layer). It should be noted that in the present embodiment, the gate insulating layer 3 does not only cover the gate electrode 2, but also covers the gate electrode 20 adjacent to the gate electrode 2.

In the step of forming the gate insulating layer, as shown in (b) in FIG. 2, an insulating material is applied to cover the gate electrode 2 (applying step). In the present embodiment, a solvent containing an organic insulating material (organic insulating material 30) such as polyimide, polyvinyl phenol, or polypropylene is applied by an application method.

Moreover, in the present embodiment, the same organic insulating material 30 is applied to the area above the gate electrode 2 and the areas other than the area above the gate electrode 2. Therefore, the organic insulating material 30 is continuously applied across the area above the gate electrode 2 and the areas other than the area above the gate electrode 2. Furthermore, the organic insulating material 30 is applied to cover the gate electrode 2 and another gate electrode 20. Therefore, the organic insulating material 30 is continuously applied across the area above the gate electrode 2 and the areas other than the area above another gate electrode 20. That is, the organic insulating material 30 is applied to cover all the electrodes and lines formed in the same layer as the gate electrode 2.

Here, since the organic insulating material 30 is applied to the substrate 1 at almost constant film thicknesses, the organic insulating material 30 is applied along ups and downs resulting from the thicknesses of the gate electrode 2 and the lines and others in the same layer as the gate electrode 2. Thus, as shown in FIG. 2, the organic insulating material 30 applied to the area above the gate electrode 2 and the others protrudes over the organic insulating material 30 applied to the area different from the area above the gate electrode 2 and others (i.e., the area where the gate electrode 2 and others are not formed).

In the state where the organic insulating material 30 applied to the area above the gate electrode 2 protrudes over the organic insulating material 30 applied to the area different from the area above the gate electrode 2, the organic insulating material 30 is heated as shown in (c) in FIG. 2 (heating step). In the present embodiment, at least part of a solvent contained in the organic insulating material 30 is vaporized by pre-baking (pre-curing) such as heat treatment as the heating step (vaporization step).

The fluidity of the organic insulating material 30 can be decreased by vaporizing the solvent contained in the organic insulating material 30 in this way. This can maintain, before pressing, the state where the organic insulating material 30 applied to the area above the gate electrode 2 protrudes over the organic insulating material 30 applied to the area different from the area above the gate electrode 2. That is, the unevenness of the surface of the organic insulating material 30 can be maintained.

It should be noted that when the heating step (vaporization step) is not performed, and the subsequent step of pressing is performed in the state where, for example, part of the organic insulating material 30 protrudes, pressure is applied under the condition that the organic insulating material 30 has a high fluidity. Since the fluidity of the organic insulating material 30 is high, the organic insulating material 30 moves to receive constant pressure. Thus, unlike the present embodiment, a density gradient cannot be produced in the organic insulating material 30.

It should be noted that in the heating step, preferably, the organic insulating material 30 should be heated at or above the boiling point of the solvent contained in the organic insulating material 30. Moreover, more preferably, the organic insulating material 30 should be heated to the temperature at or above the boiling point of the solvent contained in the organic insulating material 30. This can ensure the vaporization of at least part of the solvent in the organic insulating material 30, and a density gradient can be produced in the organic insulating material 30 in the subsequent step of pressing.

As shown in (d) in FIG. 2, the surface of the insulating material whose solvent has been vaporized is pressed with a press member 200 (pressing step). In this pressing step, the organic insulating material 30 is pressed in compression molding, and the entire surface of the organic insulating material 30 is planarized. Here, the surface of the organic insulating material 30 is uneven before being pressed, and the fluidity of the organic insulating material 30 declines. Therefore, it is likely to maintain the unevenness. Therefore, when the organic insulating material 30 is pressed with the press member 200, pressure is concentrated on the protruded part of the organic insulating material 30 above the gate electrode 2 such that the organic insulating material 30 does not flow from the protruded part to the recessed part. Thus, the organic insulating material 30 above the gate electrode 2, corresponding to the protruded part has a higher density than that of the organic insulating material 30 corresponding to the recessed part.

Moreover, in this pressing step, as shown in FIG. 2, it is preferable that the organic insulating material 30 be planarized with the press member 200 having a flat pressing surface. This means that a larger pressure can be easily applied to the protruded part of the organic insulating material 30 than to the recessed part of the organic insulating material 30. Therefore, it is possible to easily form areas of different crude densities in the organic insulating material 30.

Moreover, preferably the pressing surface of the press member 200 should be provided with an adherence-prevention protection sheet for preventing the organic insulating material 30 from adhering to the pressing surface. Thus, the pressing step can be performed with the adherence-prevention protection sheet being interposed between the press member 200 and the surface of the organic insulating material 30. This can prevent the organic insulating material 30 from adhering to the press member 200, and avoid undermining the planarization of the surface of the organic insulating material 30 after being pressed.

Moreover, after the pressing step, preferably a curing step for completely curing the organic insulating material 30 should be performed by at least one of ultraviolet irradiation treatment and heat treatment. This can form the gate insulating layer 3 of a predetermined shape having areas of different film densities.

In this curing step, when the organic insulating material 30 contains a photo-crosslinking group of a high-polymer material such as acrylic polymer or a low-polymer material such as acrylic monomer, molecular binding is formed in the molecules in the organic insulating material 30 through the irradiation of UV light and the like. Moreover, when the organic insulating material 30 contains a heat-crosslinking group, molecular binding is formed in the molecules in the organic insulating material 30 by the heat treatment. This refines the molecular structure of the organic insulating material 30, and strengthens the molecular binding, which allows the organic insulating material 30 to be completely cured.

In the step of forming the gate insulating layer, as shown in (e) in FIG. 2, the gate insulating layer 3 can be formed in which the first area 31 corresponding to the area above the gate electrode 2 has a higher density than those of the areas different from the first area 31. Specifically, it is possible to make the first area 31 corresponding to the area above the gate electrode 2 have a higher density than that of the second area 32 corresponding to the area between the gate electrode 2 and the another gate electrode 20 adjacent to the gate electrode 2. Furthermore, the film density of the third area 33 between the first area 31 and the second area 32 is the transition density from the film density of the first area 31 to the film density of the second area 32.

As shown in (a) in FIG. 3, the source electrode 4 and the drain electrode 5 are formed on the gate insulating layer 3 so as to sandwich the area above the gate electrode 2. Specifically, a source-drain metal film is formed by depositing the material of the source electrode 4 and the drain electrode 5 on the entire surface of the gate insulating layer 3. Subsequently, the source-drain metal film is patterned by photolithography or etching to form a pair of the source electrode 4 and the drain electrode 5 facing each other in a predetermined shape. The source-drain metal film can be formed using, for example, molybdenum (Mo), tungsten (W), copper (Cu), aluminum (Al), nickel (Ni), gold (Au), silver (Ag), molybdenum tungsten (MoW), or molybdenum nitride (MoN), by sputtering or evaporation. Moreover, the gate insulating layer 3 is exposed by etching out the source-drain metal film.

It should be noted that when patterning the source-drain metal film, the lines in the display panel can be patterned together with the source electrode 4 and the drain electrode 5. That is, the lines of the display panel can be formed together with the source electrode 4 and the drain electrode 5 at the same time using the same material. For example, a video signal line (source line) can be formed by patterning the source-drain metal film.

As shown in (b) in FIG. 3, the partition portion 6 having a hole is formed on the gate insulating layer 3. Specifically, a partition layer is formed by applying a predetermined material of the partition portion 6 to the entire area above the substrate 1. The partition layer is formed to cover the source electrode 4, the drain electrode 5, the exposed gate insulating layer 3, and others. Subsequently, the gate insulating layer 3 between the source electrode 4 and the drain electrode 5 is exposed again by patterning the partition layer. This uncovers an area above the gate electrode 2. Thus, the partition portion 6 of a predetermined shape having a hole and a partition (bank) can be formed. The hole of the partition portion 6 is formed to correspond to the portion where the semiconductor layer 7 is formed. The hole of the partition portion 6 is formed such that the edges of the source electrode 4 and the drain electrode 5 are exposed to the hole in a planar view.

It should be noted that the partition layer can be patterned by exposing to light and developing the partition layer. Moreover, a material containing, for example, fluorine may be used for the partition layer so that the partition layer has repellency. Alternatively, after forming a hole in the partition layer, a predetermined surface treatment may be performed for the partition layer using, for example, fluorine so that the surface of the partition layer has repellency.

As shown in (c) in FIG. 3, the semiconductor layer 7 to be electrically connected to the source electrode 4 and the drain electrode 5 is formed in the hole in the partition portion 6. Specifically, a solution (organic semiconductor solution) containing an organic semiconductor material is applied to the hole in the partition portion 6 by the ink-jet method. The organic semiconductor solution applied to the hole is held back by the facing partitions of the partition portion 6, i.e., the inner wall surface of the hole. This means that the boundary of the area to which the organic semiconductor solution is applied is defined by the partitions. This can prevent the organic semiconductor solution from flowing to the outside of the hole in the partition portion 6. It should be noted that when applying the organic semiconductor material solution by the ink-jet method, it is preferable that the organic semiconductor material solution be dropped at or near the center of the hole in the partition portion 6. Moreover, a soluble organic material of pentacene, phthalocyanine, or porphyrin can be used for the organic semiconductor material. The organic semiconductor solution is dried and solidified by performing a predetermined heat treatment, and is crystallized. Thus, the semiconductor layer 7 having a predetermined shape and a defined periphery can be formed in the hole in the partition portion 6. In the present embodiment, the semiconductor layer 7 is formed across the upper surface of the edge of the source electrode 4 and the upper surface of the edge of the drain electrode 5 so as to cover the upper surface of the exposed gate insulating layer 3.

As shown in (d) in FIG. 3, the planarization film 8 is formed on the entire area above the substrate 1. The planarization film 8 is formed at predetermined thicknesses to planarize the surface. It should be noted that the planarization film 8 can be formed by applying a predetermined material such as SOG.

It should be noted that when an organic semiconductor takes in, for example, water and oxygen, properties degradation such as variation in the threshold voltage of a transistor is caused in the organic semiconductor. Therefore, to prevent this, a protection film for preventing water, oxygen, and others from permeating may be provided between an organic semiconductor and a planarization layer.

In such a manner, the thin film transistor 10 according to the present embodiment can be fabricated.

According to the method of fabricating the thin film transistor 10 in the present embodiment, by (i) applying an organic insulating material to the substrate 1 on which the gate electrode 2 is formed, (ii) vaporizing the solvent contained in the organic insulating material which is partially protruded, and (iii) pressing the surface of the protruded part of the organic insulating material, it is possible to make the protruded part of the organic insulating material on the gate electrode 2 have a greater compressibility than that of the other part of the organic insulating material. Thus, in the present embodiment, by using a compressibility difference given to the organic insulating material, the gate insulating layer 3 including the first area 31 and the second area 32 which have different film densities can be formed.

It should be noted that in the application step in the step of forming the gate insulating layer in the present embodiment, it is preferable that the organic insulating material be applied so as to be thicker than the gate electrode 2. Accordingly, when pressing the entire organic insulating material, a higher pressure can be easily applied to the protruded part of the organic insulating material 30 above the gate electrode 2, and the protruded part can be efficiently compressed. Therefore, it is possible to easily form areas of different film densities in the gate insulating layer 3.

Moreover, in the application step in the step of forming the gate insulating layer, the first area 31, the second area 32, and the third area 33 in the gate insulating layer 3 can be applied using organic insulating materials made of different substances. However, preferably, the first area 31, the second area 32, and the third area 33 should be made of the same substance. By so doing, an interface between areas of different densities is not formed. This can suppress degradation in the voltage endurance characteristics of the gate insulating layer 3. Furthermore, by forming the gate insulating layer 3 with the same substance, the step of forming the gate insulating layer 3 can be simplified when compared to the case where the gate insulating layer 3 is formed with different kinds of materials having different densities.

Moreover, preferably, the heating step (vaporization step) in the step of forming the gate insulating layer in the present embodiment should be performed such that at least the surface of the organic insulating material is solidified. By solidifying the surface of the organic insulating material, when the organic insulating material 30 is pressed with the press member, a high pressure can be applied to the protruded part of the organic insulating material 30 above the gate electrode 2 and others. This can make the organic insulating material 30 above the gate electrode 2 and others have a higher compressibility than that of the organic insulating material 30 except the area above the gate electrode 2 and others. Therefore, it is possible to easily densify of the organic insulating material 30 above the gate electrode 2 and others.

Figure 6B:
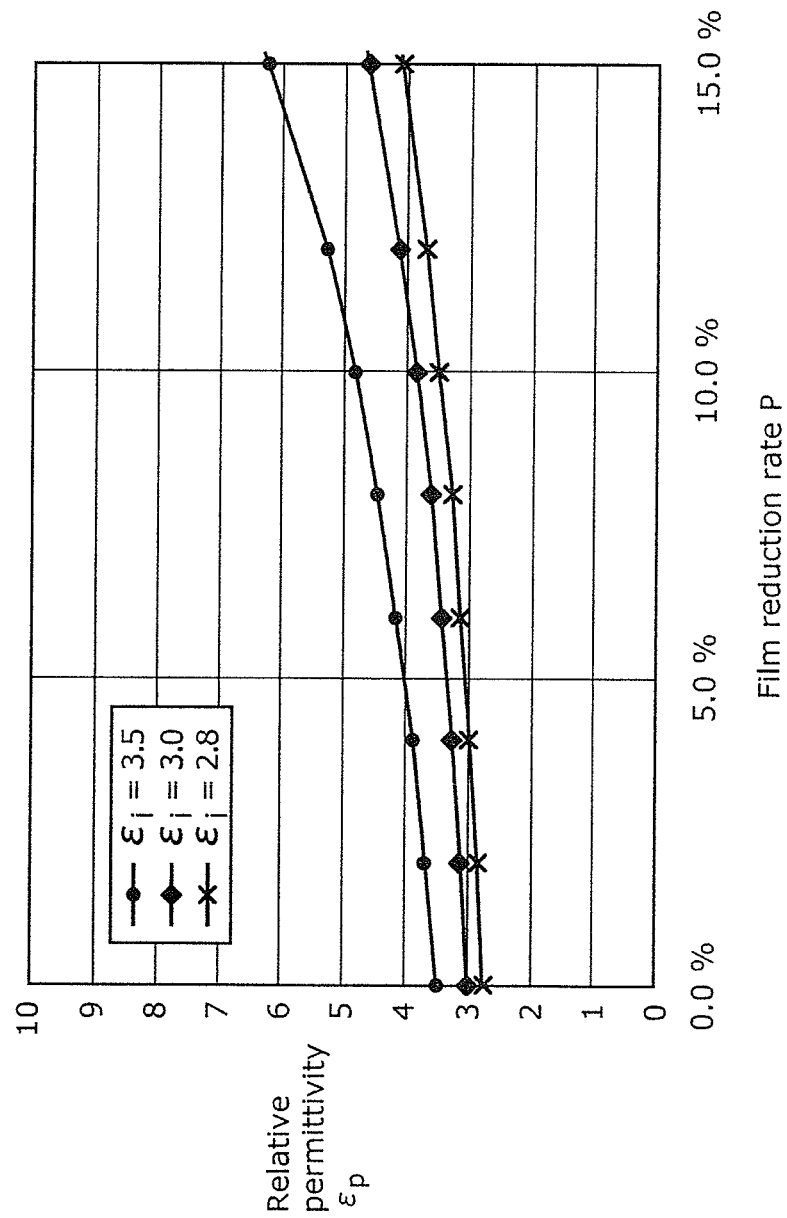
FIG. 6B illustrates the relationship between the film reduction rate of a gate insulating layer in a thin film transistor according to the embodiment and the relative permittivity of the gate insulating layer after being pressed.

It should be noted that the following describes changes in permittivity caused by pressing the gate insulating layer 3 (insulating film) with a press member, with reference to FIGS. 6A and 6B. FIG. 6A illustrates a gate insulating layer (insulating film) before and after being pressed in the thin film transistor according to the present embodiment. FIG. 6B illustrates the relationship between the film reduction rate of the gate insulating layer (insulating film) in the thin film transistor according to the embodiment and the relative permittivity of the gate insulating layer (insulating film) after being pressed.

As shown in FIG. 6A, the gate insulating layer 3 (insulating film) becomes thinner by being pressed with the press member. Here, it is defined regarding the insulating film before being pressed that the thickness is $d_i$, and the relative permittivity is $\in_i$. Moreover, it is defined regarding the insulating film after being pressed that the thickness is $d_p$, the relative permittivity is $\in_p$, and the thickness by which the insulating film has decreased by being pressed is $d_a$.

In this case, the relative permittivity $\in_p$ of the insulating film after being pressed can be expressed by the following expression.

$$\in_p = \in_i(1-P)/(1-\in_i \cdot P)$$

In the above expression, P denotes the film reduction rate which is the reduction rate of the thickness of an insulating film, and is expressed by $P = d_a/d_i$.

FIG. 6B denotes the relationship between the film reduction rate P of the insulating film and the relative permittivity $\in_p$ of the insulating film after being pressed. FIG. 6B illustrates the data when insulating films have the relative permittivity $\in_i$ before pressing of 3.5 (•), 3.0 (♦), and 2.8 (x), respectively.

As shown in FIG. 6B, for any insulating films, as the film reduction rate P increases by pressing the film, the relative permittivity $\in_i$ also increases. It should be noted that regarding the insulating film having a relative permittivity $\in_i$ of 3.0, when the film thickness is compressed to 90% (i.e., when the film reduction rate is 10.0%), the relative permittivity $\in_p$ of the insulating film after being pressed improves to 129% over the relative permittivity $\in_i$ of the insulating film before being pressed.

Figure 4:
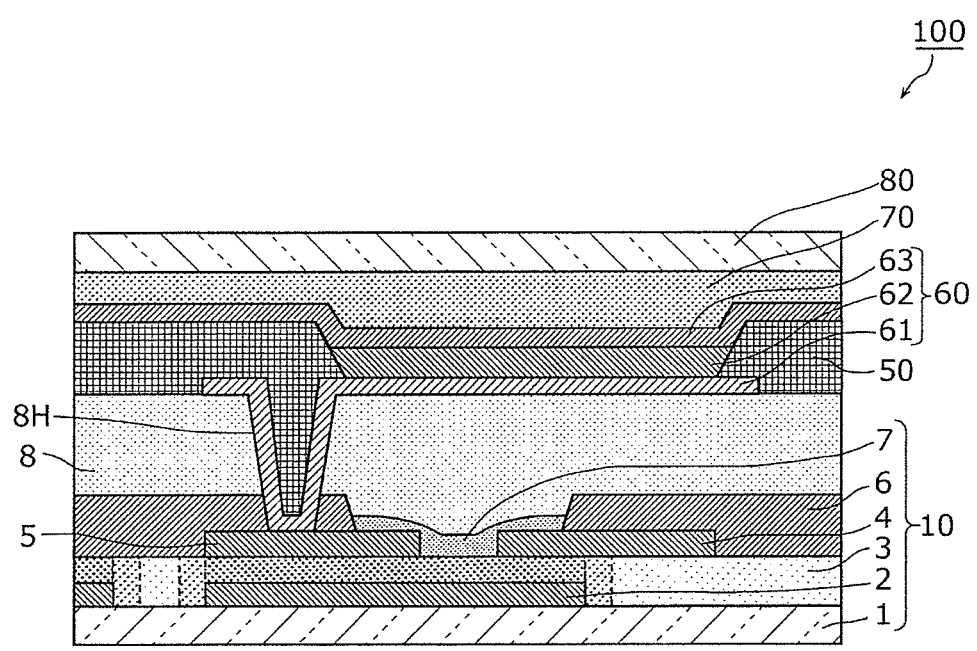
FIG. 4 is a cross-sectional view illustrating a configuration of an organic EL light emitting device according to the embodiment.

With reference to FIG. 4, the following describes an organic EL light emitting device 100 according to the present embodiment. FIG. 4 is a cross-sectional view illustrating a configuration of an organic EL light emitting device according to the embodiment.

The organic EL light emitting device 100 according to the present embodiment is an organic EL display panel including a pixel unit (display) in which pixels are arrayed in a matrix, and includes an EL layer including organic EL devices each corresponding to one of the pixels and a TFT layer including a pixel circuit unit having the thin film transistor 10, lines and others. The pixel circuit unit includes driving transistors for driving pixels and switching transistors for selecting pixels, each of which corresponds to one of the pixels, a source line, a gate line, and a power line, for example. The organic EL light emitting device shown in FIG. 4 illustrates a configuration of one pixel (sub-pixel) in the display panel.

As shown in FIG. 4, the organic EL light emitting device 100 includes the thin film transistor 10 on the substrate 1, the planarization film 8 over the thin film transistor 10, an organic EL device 60 which is on the planarization film 8 and includes a lower electrode 61, an organic layer 62, and an upper electrode 63, a partition portion 50 by which the organic layer 62 is separated into portions corresponding to individual pixels, a sealing layer 70 over the organic EL device 60, and a sealing substrate 80.

The thin film transistor 10 is a thin film transistor in the present embodiment, and in particular an organic thin film transistor in which the semiconductor layer 7 is made of an organic material. The thin film transistors 10 are arrayed on the substrate 1. Moreover, since the thin film transistor 10 is a p-channel driving transistor, the drain electrode 5 is electrically connected to the lower electrode 61 of the organic EL device 60. It should be noted that FIG. 4 does not show a switching transistor.

As shown in FIG. 4, a contact hole 8H is provided in the planarization film 8 to connect the lower electrode 61 of the organic EL device 60 and the drain electrode 5 of the thin film transistor 10 (extended part of the drain electrode 5). The contact hole 8H can be formed by removing the planarization film 8 above the drain electrode 5. Since this can expose the surface of the drain electrode 5, the drain electrode 5 and the lower electrode 61 are connected via the contact hole 8H.

The organic EL device 60 in the present embodiment is a top-emission organic EL device, and is formed for each pixel (light-emitting unit) on the planarization film 8. The organic EL device 60 includes the lower electrode 61, the organic layer 62, and the upper electrode 63.

The lower electrode 61 is formed on the planarization film 8, and serves as a positive electrode (anode) to which a current from the driving circuit unit flows and the pixel electrode of the organic EL device 60. Moreover, since the organic EL device 60 in the present embodiment is the top-emission type, the lower electrode 61 serves as a reflecting electrode. The lower electrode 61 as the reflecting electrode can have, for example, (i) a single-layer structure of a reflecting metal such as aluminum (Al) or silver alloy APC or (ii) a two-layer structure of a transparent metal oxide such as indium tin oxide (ITO) and a reflecting metal such as silver alloy. The lower electrodes 61 are separated so that each corresponds to one of the pixels. It should be noted that for the bottom-emission organic EL device, the lower electrode 61 is a transparent electrode only made of a transparent metal oxide such as ITO.

Moreover, as described above, the lower electrode 61 is electrically connected to the drain electrode 5 of the thin film transistor 10 via the contact hole 8H penetrating the planarization film 8. Thus, a current corresponding to a data voltage supplied from a source line is supplied from the drain electrode 5 of the thin film transistor 10 as a driving transistor to the lower electrode 61.

The organic layer 62 is formed on the lower electrode 61 for each pixel, and is an organic EL layer including a light emitting layer made of a predetermined organic light emitting material. The light emitting layer emits light when the light emitting material of the light emitting layer is excited by energy caused when electrons and holes are reunited which have been injected by applying a predetermined voltage to the lower electrode 61 and the upper electrode 63. The light emitting layer may be a stacked structure including a lower layer of Bis [N-(1-naphthyl)-N-phenyl] benzidine ($\alpha$-NPD) and an upper layer of tris-(8-hydroxyquinoline) aluminum ($Alq_3$).

Moreover, the organic layer 62 includes a hole injection layer, a hole transport layer, an electron transport layer, or an electron injection layer, in addition to the light emitting layer. All or a part of these layers are stacked. In this case, a chemical compound such as polyethylenedioxythiophene (PEDOT) can be used for the hole injection layer, for example. Triphenylamine, polyaniline, or the like can be used for the hole transport layer. Polyphenylene vinylene (PPV) or the like can be used for the electron injection layer.

The upper electrode 63 is a negative electrode (cathode) from which a current flows to the driving circuit unit, and serves to apply, to the light emitting layer, a voltage negative with respect to the lower electrode 61 to inject electrons to the light emitting layer. The upper electrode 63 is a transparent electrode opposite to the lower electrode 61, and is formed on the organic layer 62. It should be noted that the upper electrode 63 in the present embodiment is a common electrode shared by the pixels. Preferably, a material or structure having a high transmittance should be used for the upper electrode 63. The upper electrode 63 can be made of a transparent metal oxide such as ITO or indium zinc oxide (IZO). It should be noted that the potential of the upper electrode 63 is a ground potential in the present embodiment.

The partition portion 50 has (i) an hole for separating the organic layer 62 from the organic layer 62 of another pixel and (ii) a partition (bank) by which the boundary of the organic layer 62 is defined. The partition portion 50 is formed on the planarization film 8. The partition of the partition portion 50 can be formed with a photosensitive material such as a resist, and a hole can be formed by partially exposing to light and developing this photosensitive resin.

The sealing layer 70 not only serves as a bonding layer for bonding the substrate 1 for which the step of forming the organic EL element 60 has been performed and the sealing substrate 80, but also serves as a protection layer for sealing and protecting the organic EL device 60. A resin such as an acrylic resin or an epoxy resin can be used for the material of the sealing layer 70, for example. It should be noted that to further protect the organic EL device 60 from water and oxygen, a thin film sealing layer may be formed between the upper electrode 63 and the sealing layer 70. A transparent insulating material such as silicon nitride (SiN) or silicon oxynitride (SiON) can be used for a thin film sealing layer.

The sealing substrate 80 is a substrate for sealing the organic EL device 60 and protecting the organic EL light emitting device 100 from the outside. That is, the sealing substrate 80 forms the outer surface of the organic EL light emitting device 100. Moreover, the sealing substrate 80 is a translucent substrate through which light emitted from the light emitting layer of the organic EL device 60 is transmitted. A substrate such as a transparent glass substrate can be used for the sealing substrate 80. It should be noted that color filters each corresponding to red, green, or blue may be, if necessary, formed inside the sealing substrate 80. In this case, light which transmitted through the color filters transmits through the sealing substrate 80 to the outside.

According to the organic EL light emitting device 100 in the present embodiment, since the thin film transistor 10 having the gate insulating layer 3 with excellent voltage endurance characteristics is used, a method of thickening the gate electrode 2 can be employed as a method of reducing line resistance. This can thicken lines which are patterned together with the gate electrode 2 at the same time, and realize low resistance lines. Therefore, even when the organic EL light emitting device 100 becomes bigger, lines with less current losses can be realized. Accordingly, it is possible to realize an organic EL light emitting device capable of high-speed operation.

Furthermore, in the thin film transistor 10 according to the present embodiment, the first area 31 above the gate electrode 2 has a higher density than that of the second area 32 different from the area above the gate electrode 2. Therefore, the relative permittivity of the gate insulating layer 3 above the gate electrode 2 is higher than that of another area. This can densify carriers induced to the channel area of the semiconductor layer 7. Thus, TFT characteristics can be improved. Therefore, it is possible to realize an organic EL light emitting device capable of higher-speed operation.

Furthermore, in the organic EL light emitting device 100, a storage capacity unit (capacitor including the gate electrode 2 and the source electrode 4 or the drain electrode 5) is provided for each pixel. The gate insulating layer 3 above the gate electrode 2 has a higher relative permittivity than that of another area. Therefore, it is possible to decrease the size (area) of the storage capacity unit. Accordingly, not only pixels can be easily miniaturized, but also the degree of freedom for a pixel layout can be improved.

Moreover, the gate insulating layer 3 (second area 32) between the gate electrodes of adjacent pixels has a lower relative permittivity than those of other areas of the gate insulating layer 3. Since this can decrease parasitic capacitance in the organic EL light emitting device 100, not only a panel can be easily upsized, but also high-speed operation can be performed.

A thin film transistor, an organic EL light emitting device, and a method of fabricating the thin film transistor according to the present disclosure have been described based on the present embodiment. However, the present disclosure is not limited to the above embodiment.

For example, the gate insulating layer 3 is made of the same substance in the above embodiment. However, the gate insulating layer 3 may be made of different kinds of substances having different relative permittivities. In this case, for example in the application step in the step of forming the gate insulating layer, this can be achieved in such a manner that (i) a first organic insulating material with a first relative permittivity is applied toward the gate electrode 2, and (ii) a second organic insulating material with a second relative permittivity different from the first relative permittivity is applied to the area other than the area above the gate electrode 2.

Moreover, although the semiconductor layer 7 is an organic semiconductor layer in the embodiment, another layer may be used. For example, the semiconductor layer 7 may be an inorganic semiconductor layer made of silicone, germanium, or others. It should be noted that in this case, the semiconductor layer made of silicone or others can be patterned into a predetermined shape by etching after forming a thin film of the semiconductor layer by chemical vapor deposition (CVD). Therefore, the partition portion 6 does not have to be formed.

Moreover, in the above embodiment, the organic insulating material 30 is pressed which has been applied to cover at least two electrodes including the gate electrode 2 and the another gate electrode 20. However, in the application step and the pressing step, the organic insulating material 30 may be pressed which has been applied to cover at least one gate electrode.

Moreover, although the third area 33 is the area along the gate electrode 2 in the present embodiment, part of the third area 33 may be above the gate electrode 2. For example, in (b) in FIG. 2, when an insulating film material is applied to cover the gate electrode 2, and the insulating material is thinner at the edges of the gate electrode 2 than at the center area of the gate electrode 2, the third area 33 may be above the gate electrode 2.

Moreover, although the cross-sectional shape of the gate electrode 2 is rectangular in the embodiment, the gate electrode 2 may have other shapes. For example, as shown in (a) in FIG. 5, the cross-sectional shape of the gate electrode 2 may be a flared trapezoid having a decreasing thickness at the sides. In particular, when the gate electrode 2 is processed by wet etching, the both edges of the gate electrode 2 tend to be flared. It should be noted that (a) in FIG. 5, which corresponds to the process in (b) in FIG. 2, shows that the organic insulating material 30 for forming the gate insulating layer 3 is applied to cover the gate electrode 2.

It should be noted that the gate insulating layer 3 as shown in (b) in FIG. 5 is formed by performing the vaporization step and pressing step for the organic insulating material 30 shown in (a) in FIG. 5. That is, the first area 31 having a higher film density than those of other areas is above the central area of the gate electrode 2 at which the gate electrode 2 is thickest. Moreover, the third areas 33 include at least the areas above the flared sides of the gate electrode 2 having a decreasing thickness. The second areas 32 are more distant from the gate electrode 2 than the third area 33 are.

Moreover, although the thin film transistor 10 is used for an organic EL light emitting device in the embodiment, the application of the thin film transistor 10 is not limited to this. For example, the thin film transistor 10 is applicable to other display devices such as liquid crystal displays. Moreover, the display devices can be used as flat panel displays, and is applicable to electronic equipment such as television sets, personal computers, and cellular phones.

Moreover, by forming the thin film transistors 10 on the substrate 1, the thin film transistors 10 in the embodiment can be also arranged in a thin film transistor array.

Moreover, although the thin film transistor 10 is a p-channel TFT in the embodiment, it may be an n-channel TFT.

It should be noted that the present disclosure includes embodiments which can be obtained by making various modifications which those skilled in the art would conceive, for each embodiment and embodiments which can be achieved by arbitrarily combining the structural elements and functions in each embodiment without departing from the scope of the present disclosure.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

A thin film transistor and an organic EL light emitting device according to the present disclosure are widely applicable to display devices in television sets, personal computers, cellular phones, or the like, or other various electrical apparatuses.

The invention claimed is:

1. A thin film transistor comprising:
   a gate electrode above a substrate;
   a gate insulating layer covering the gate electrode;
   a semiconductor layer above the gate insulating layer; and
   a source electrode and a drain electrode which are above the gate insulating layer, and electrically connected to the semiconductor layer,
   wherein the gate insulating layer is a single layer and includes a first area and a second area with a same material as the first area, the first area being above the gate electrode, the second area being different from an area above the gate electrode,
   the first area has a higher density than a density of the second area,
   the gate insulating layer has a flat surface at an area above which an area where the semiconductor layer and at least one of the source electrode and the drain electrode are contiguous is located, and
   the gate electrode extends below and is wider than the semiconductor layer in a width direction of the gate electrode.

2. The thin film transistor according to claim 1, wherein the second area is between the gate electrode and another gate electrode adjacent to the gate electrode.

3. The thin film transistor according to claim 2, wherein the gate insulating layer includes a third area between the first area and the second area, and
   the third area has a density which transitions from the density of the first area to the density of the second area.

4. The thin film transistor according to claim 1, wherein the gate insulating layer is an organic insulating film.

5. The thin film transistor according to claim 4,
   wherein the organic insulating film is made of an organic material to part of which an inorganic material is added.

* * * * *